United States Patent
Du et al.

(10) Patent No.: US 7,691,668 B2
(45) Date of Patent: Apr. 6, 2010

(54) METHOD AND APPARATUS FOR MULTI-CHIP PACKAGING

(75) Inventors: Yong Du, Cupertino, CA (US); John Yan, Union City, CA (US)

(73) Assignee: Spansion LLC, Sunnyvale, CA (US)

( * ) Notice: Subject to any disclaimer, the term of this patent is extended or adjusted under 35 U.S.C. 154(b) by 676 days.

(21) Appl. No.: 11/612,992

(22) Filed: Dec. 19, 2006

(65) Prior Publication Data
US 2008/0142942 A1 Jun. 19, 2008

(51) Int. Cl.
*H01L 21/00* (2006.01)

(52) U.S. Cl. .................. 438/106; 438/107; 438/108

(58) Field of Classification Search .......... 438/106–109
See application file for complete search history.

(56) References Cited

U.S. PATENT DOCUMENTS

| | | | | |
|---|---|---|---|---|
| 5,291,061 A | * | 3/1994 | Ball | 257/686 |
| 5,963,794 A | * | 10/1999 | Fogal et al. | 438/108 |
| RE36,613 E | * | 3/2000 | Ball | 257/777 |
| 6,051,878 A | * | 4/2000 | Akram et al. | 257/686 |
| 6,051,886 A | * | 4/2000 | Fogal et al. | 257/777 |
| 6,222,265 B1 | * | 4/2001 | Akram et al. | 257/723 |
| 6,531,338 B2 | * | 3/2003 | Akram et al. | 438/108 |
| 7,067,927 B1 | * | 6/2006 | Mostafazadeh | 257/777 |
| 7,187,075 B1 | * | 3/2007 | Hwa et al. | 257/707 |
| 7,205,651 B2 | * | 4/2007 | Do et al. | 257/706 |
| RE40,061 E | * | 2/2008 | Ball | 438/109 |
| 2002/0045290 A1 | * | 4/2002 | Ball | 438/106 |
| 2003/0203537 A1 | * | 10/2003 | Koopmans | 438/109 |
| 2004/0195591 A1 | * | 10/2004 | Gehman et al. | 257/202 |
| 2005/0009236 A1 | * | 1/2005 | Ball | 438/113 |
| 2005/0161791 A1 | * | 7/2005 | Hortaleza | 257/685 |
| 2006/0121645 A1 | * | 6/2006 | Ball | 438/109 |
| 2007/0117266 A1 | * | 5/2007 | Ball | 438/108 |
| 2009/0045496 A1 | * | 2/2009 | Tian et al. | 257/686 |

* cited by examiner

*Primary Examiner*—Laura M Menz

(57) ABSTRACT

A method and apparatus are provided for multi-chip packaging. A multi-chip package (100) includes a substrate (105) and a plurality of semiconductor dice (110, 120, 130). A first semiconductor die (110) is physically coupled to an upper face of the substrate (105), the first semiconductor die (110) being a smallest one of the plurality of semiconductor dice (110, 120, 130).

8 Claims, 4 Drawing Sheets

US 7,691,668 B2

METHOD AND APPARATUS FOR MULTI-CHIP PACKAGING

FIELD OF THE DISCLOSURE

The present invention generally relates to semiconductor packaging, and more particularly relates to a method and apparatus for multi-chip packaging.

BACKGROUND OF THE DISCLOSURE

Multi-chip packaging is a semiconductor packaging technology which stacks two or more semiconductor die with the same or different sizes in a single package. When packaging multiple semiconductor dice in a conventional multi-chip package where the semiconductor die sizes are different, the biggest die is placed on a substrate and the smaller die is placed on top of the larger die and attached thereto using adhesive. The contacts on the upper die are wirebonded to pads on the substrate. The pads for the upper die are necessarily located outside the footprint of the bottom die requiring that the substrate necessarily be larger than the largest die. Multi-chip packages can commonly be found in portable electronic devices such as cellular telephones and digital cameras. As these devices increase functionality and complexity while decreasing size, smaller semiconductor package sizes become a requirement. Conventional multi-chip packages provide space savings by packaging several die in a single package, but are constrained to be larger than the largest die in the package by sufficient area to locate contact pads for all the semiconductor dice in the package on the substrate outside the footprint of the largest die.

Accordingly, it is desirable to provide a method and apparatus for multi-chip packaging which retains the benefits of conventional multi-chip packages while allowing for reduction in the size of the packages. Furthermore, other desirable features and characteristics of the present invention will become apparent from the subsequent detailed description of the invention and the appended claims, taken in conjunction with the accompanying drawings and this background of the invention.

BRIEF SUMMARY OF THE DISCLOSURE

A method is provided for packaging a plurality of semiconductor dice into a single multi-chip package. The method includes the steps of providing a substrate and coupling a first semiconductor die to the substrate, wherein the first semiconductor die is smaller than all the other semiconductor dice.

A multi-chip package is also provided which includes a substrate and a plurality of semiconductor dice. A first one of the plurality of semiconductor dice is physically coupled to an upper face of the substrate, the first one of the plurality of semiconductor dice being a smallest one of the plurality of semiconductor dice.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
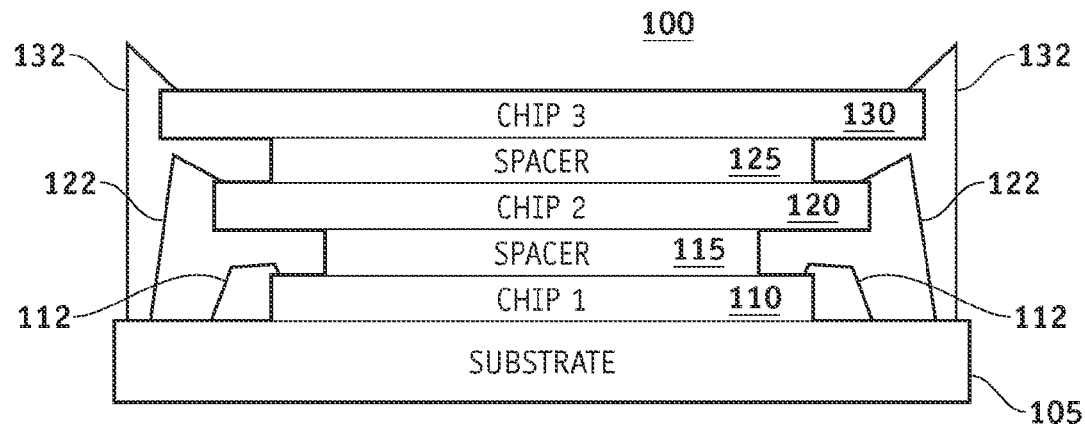
FIG. 1 is a front cross-sectional view of a multi-chip package in accordance with an embodiment of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Before describing in detail embodiments that are in accordance with the present invention, it should be observed that the embodiments reside primarily in combinations of assembly process steps and apparatus components related to multi-chip packages. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," or "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Referring to FIG. 1, a front cross-sectional of a multi-chip package 100 in accordance with an embodiment includes a substrate 105 on which a plurality of semiconductor dice 110, 120, 130 are mounted. A first one of the semiconductor dice 110 is physically coupled to an upper face of the substrate 105 by an adhesive (not shown) in a manner known to those skilled in the art. In accordance with the embodiment, the first one of the semiconductor dice 110 is the smallest one of the plurality of semiconductor dice mounted in the multi-chip package 100.

A first spacer 115 is smaller than the first one of the semiconductor dice 110 and is adhered to an upper layer of the first one of the semiconductor dice 110 with the adhesive. The second one of the semiconductor dice 120 is physically coupled to an upper face of the first spacer 115 by the adhesive. A second spacer 125, smaller than the second one of the semiconductor dice 120, is adhered to an upper layer of the second one of the semiconductor dice 120 with the adhesive, and the third one of the semiconductor dice 130 is physically coupled to an upper face of the second spacer 125 by the adhesive. In accordance with the embodiment, the second one of the semiconductor dice 120 is larger than the first one of the plurality of semiconductor dice 110 and smaller than the third one of the plurality of semiconductor dice 130. Thus, it can be seen from the front view of FIG. 1 that the arrangement of the plurality of semiconductor dice 110, 120, 130 from smallest length on the bottom next to the substrate 105 to the largest length on top forms a reverse pyramid structure.

The first one of the plurality of semiconductor dice 110 is electrically coupled to the substrate by wirebonds 112. The second one of the plurality of semiconductor dice 120 is electrically coupled to the substrate by wirebonds 122. The third one of the plurality of semiconductor dice 130 is electrically coupled to the substrate by wirebonds 132. As those skilled in the art will understand, external contacts on the upper face of the plurality of semiconductor dice 110, 120, 130 are wirebonded by wirebonds 112, 122, 132 to contact pads of an electrical conductive layer formed on the upper surface of the substrate 105. As can be seen from the arch of wirebonds 112, a first portion of the contact pads on the upper face of the substrate 105 to which the wirebonds 112 connect are under a footprint of upper ones of the semiconductor dice 120, 130. This allows advantageous reduction of the required size of the substrate 105 as compared to conventional pyramid-stacked multi-chip packages.

Figure 2:
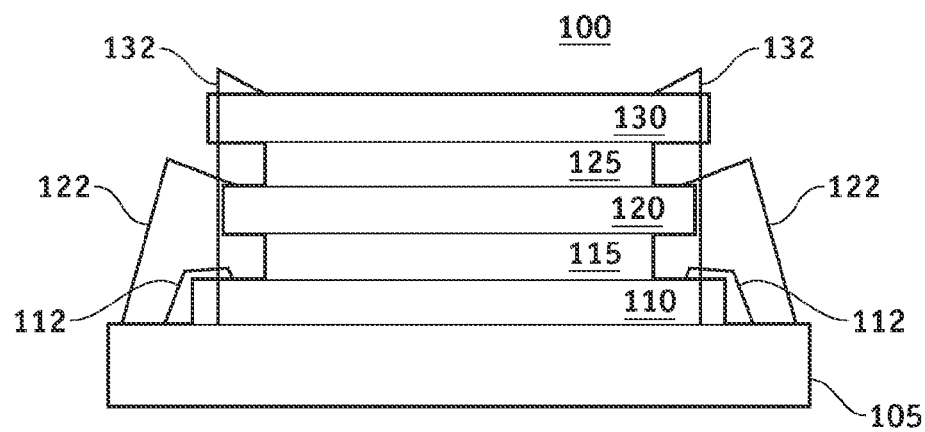
FIG. 2 is a side cross-sectional view of the multi-chip package of FIG. 1 in accordance with the embodiment.

FIG. 2 is a side cross-sectional view of the multi-chip package 100 of FIG. 1. From this view it can be seen that the width of the plurality of semiconductor dice 110, 120, 130 does not necessarily stack up in a reverse pyramid formation. In accordance with this embodiment, the first one of the plurality of semiconductor dice 110 is smaller than either the second one or the third one of the plurality of semiconductor dice 120, 130 because the upper surface area thereof is smaller. Thus, as the length of the plurality of semiconductor dice 110, 120, 130 is the dominant criteria for surface area, the plurality of semiconductor dice 110, 120, 130 are arranged in a reverse pyramid in accordance with the length thereof.

Figure 3:
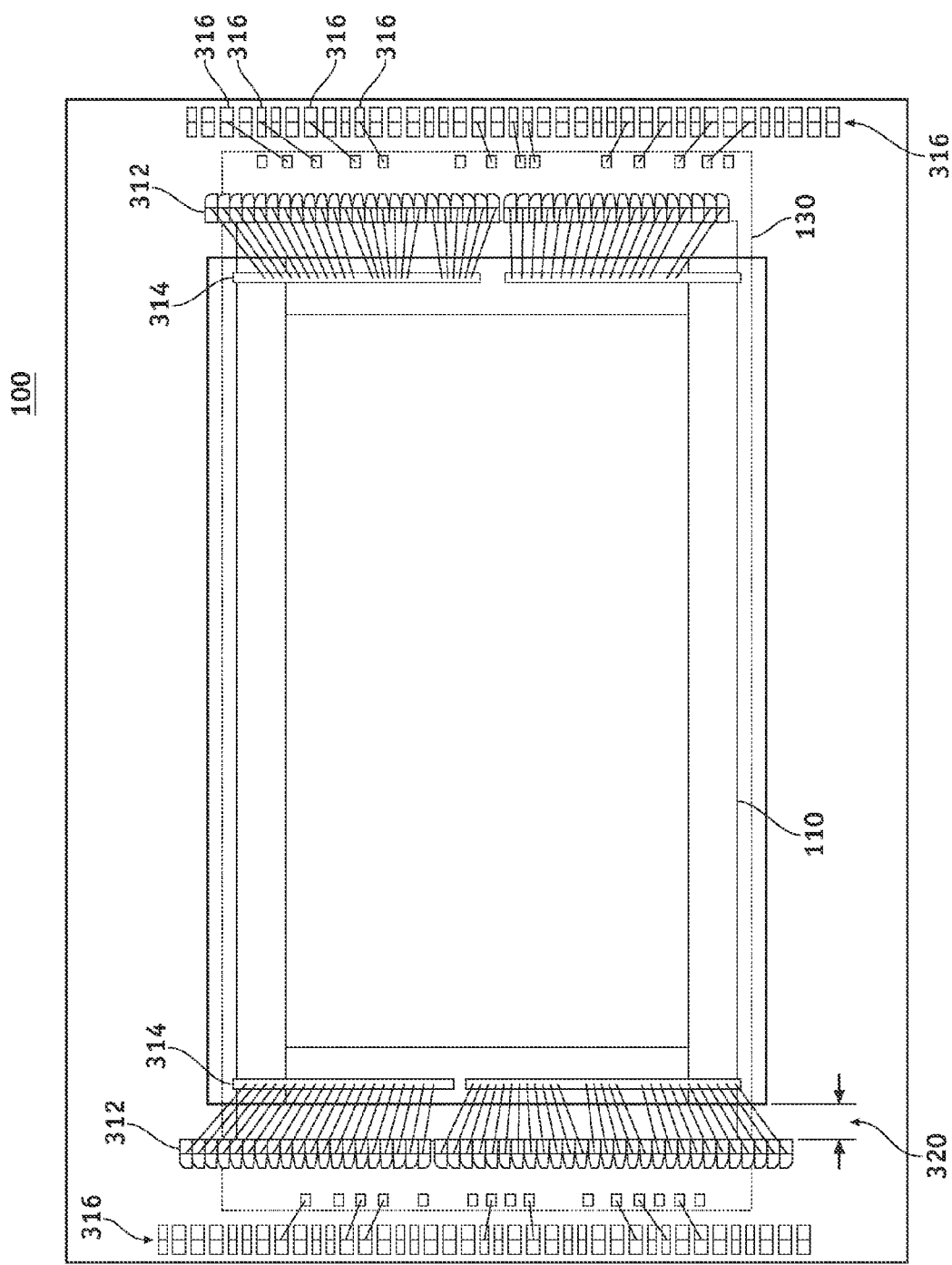
FIG. 3 is a top planar view of the multi-chip package of FIG. 1 in accordance with the embodiment.

Referring to FIG. 3, a top planar view of the multi-chip package of FIG. 1 shows the substrate 105. An outline of the first one of the plurality of semiconductor dice 110 can be seen as well as a dotted outline of the footprint of the third one of the plurality of semiconductor dice 130. An electrically conductive layer is formed on the upper surface of the substrate 105 which includes a plurality of contact pads (called bond fingers) which have a first portion 312 for electrically connecting to electrically conductive contacts 314 on the upper surface of the first one of the plurality of semiconductor dice 110 by the wirebonds 112.

In order to accommodate the pitch of the wirebonds 112 (i.e., the horizontal planar length of the wirebonds) a die attach clearance distance 320 is required for each one of the plurality of semiconductor dice 110, 120, 130. In a conventional pyramid packaging formation, the die attach clearance distance 320 for the largest semiconductor die on the bottom places the first set of bond fingers a certain distance out from the largest semiconductor dice and each further set of contact pads even farther out, thereby requiring a substrate which has all of the contact pads formed thereon outside the footprint of the largest semiconductor die. In accordance with the embodiment described herein, the present invention provides a multi-chip package structure which allows for some of the contact pads (e.g., the first portion of the contact pads 312 to be formed within the footprint of the largest one of the plurality of semiconductor dice 130, thereby allowing reduction in the size of the substrate 105 and overall reduction in the size of the multi-chip package 100. Second and third portions of the contact pads 316 provide bond fingers for connection of wirebonds from the second and third ones of the plurality of semiconductor dice 120, 130.

Figure 4:
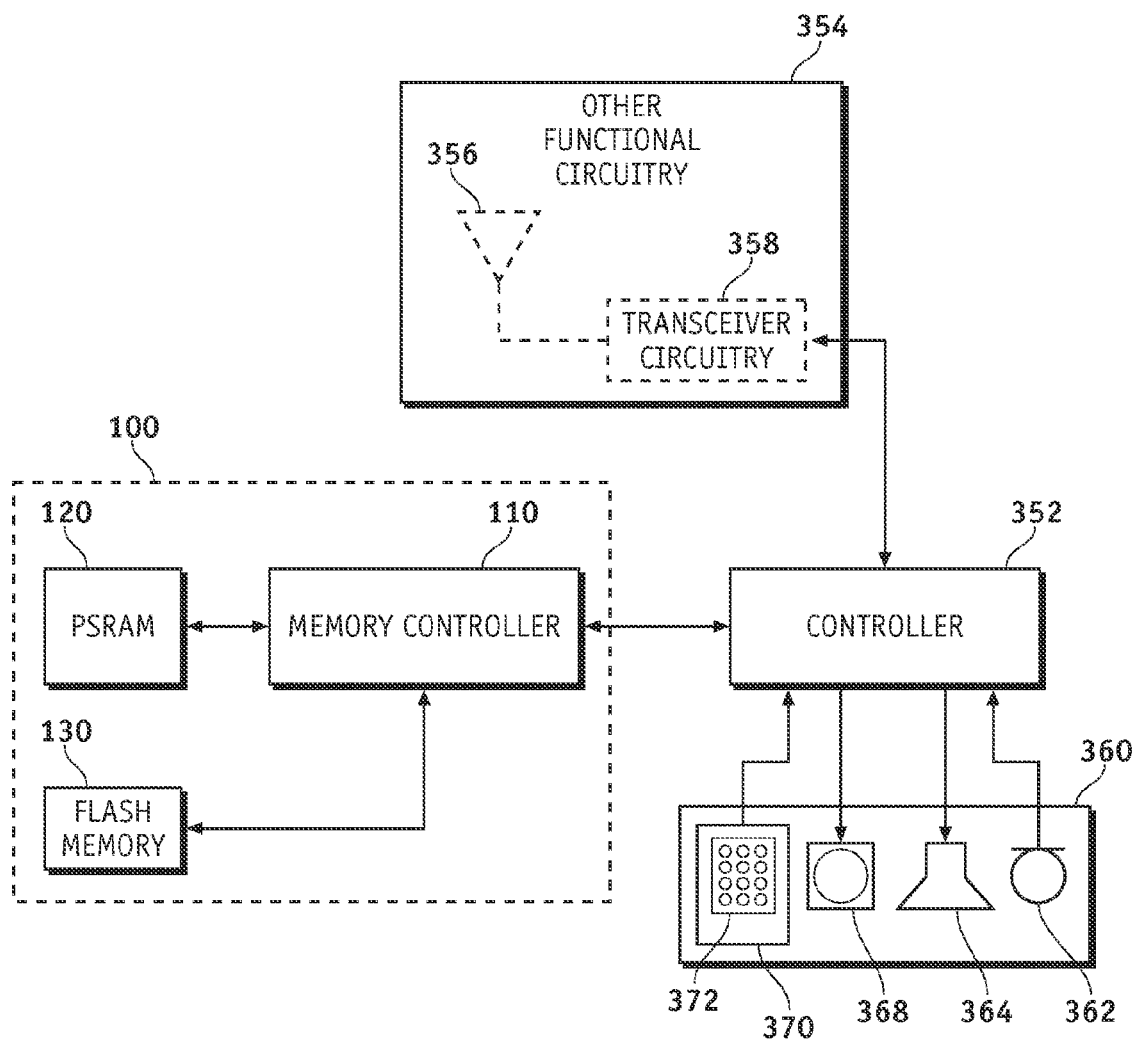
FIG. 4 is a block diagram of an electronic device incorporating the multi-chip package of FIG. 1 in accordance with the embodiment.

FIG. 4 is a block diagram of an electronic device 350, such as a cellular telephone, incorporating the multi-chip package 100 in accordance with the embodiment described herein, such as the improved memory device described above. While the electronic device 350 discusses application of the multi-chip package 100 in a cellular telephone, the multi-chip package 100 can also be implemented in personal digital assistants (PDAs), compact disc (CD) or digital video disc (DVD) players, digital audio and video players such as MP3 players, television remote controls, household appliances, automobile control systems, and other electronic devices.

The electronic device 350 includes a controller 352, such as a microprocessor, coupled to functional circuitry 354 for operation of the electronic device 350 in accordance with its function. For example, where the electronic device 350 is a cellular telephone, the functional circuitry would include an antenna 356 for receiving and transmitting radio frequency (RF) signals coupled to transceiver circuitry 358 in a manner familiar to those skilled in the art. The transceiver circuitry 358 includes receiver circuitry and transmitter circuitry. The receiver circuitry demodulates and decodes received RF signals to derive information therefrom and is coupled to the controller 352 and provides the decoded information thereto for utilization by the controller 352 in accordance with the function(s) of the electronic device 350. The controller 352 also provides information to the transmitter circuitry of the transceiver circuitry 358 for encoding and modulating the information into RF signals for transmission from the antenna 356.

As is well-known in the art, the controller 352 is coupled to conventional user interface devices 360 including any or all of: a microphone 362, a speaker 364, a display 366, and/or functional key inputs 368, including perhaps a keypad 370.

In accordance with the embodiment, the controller 352 is also coupled to the multi-chip package 100. The multi-ship package 100 provides multiple semiconductor dies in a single package supplied to the manufacturer of the electronic device 350 and coupled to the controller to provide additional functionality and/or improved performance for the electronic device.

One embodiment of the multi-chip package 100 could provide an improved memory package for the electronic device 350 which stores data and operational information for use by the controller 352 to perform the functions of the electronic device 350. The memory package could, for example, include a memory controller semiconductor die 110, a volatile memory semiconductor die 120, such as a static random access memory (SRAM) die or pseudo-SRAM (PSRAM) die and a non-volatile memory semiconductor die 130, such as a Flash memory die. This structure could allow for an improved memory package where the memory controller 110 could take advantage of the speed and storage capability of the PSRAM die 120 during operation, while maintaining the non-volatility and storage capability of the Flash memory die 130. In addition, packaging the three semiconductor dies 110, 120, 130 together could take advantage of the synergy of the combination and the in-package control of the logic memory controller 110 to provide speed and heightened performance through the patterned electrically conductive layer on the substrate 105 with connection to the controller 352 via minimal leads connecting to a printed circuit board of the electronic device 350.

In accordance with the embodiment, the memory controller semiconductor die 110 would be the smallest of the three semiconductor dies in the package 100 and the PSRAM die 120 would be the next smallest die.

Figure 5:
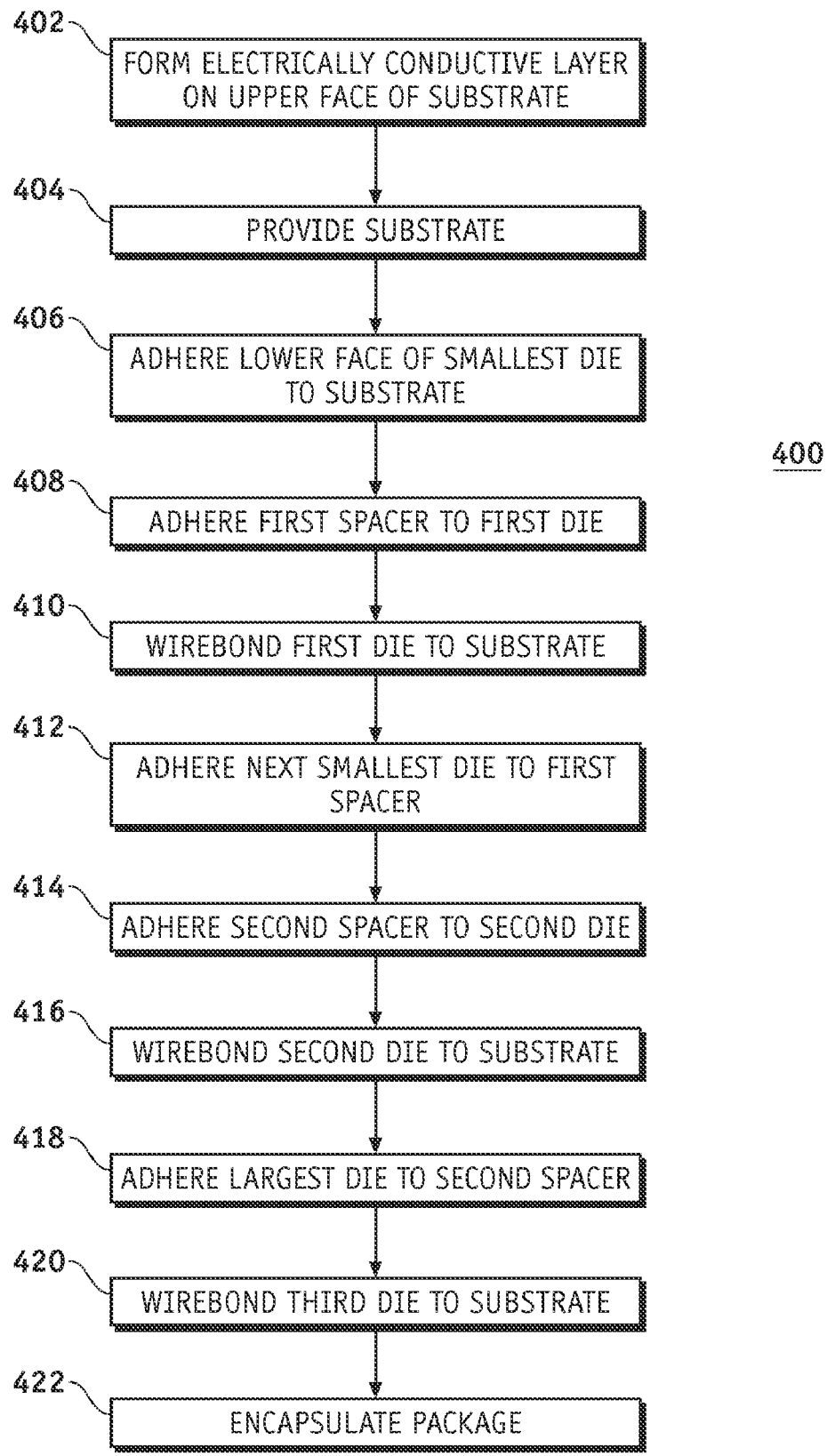
FIG. 5 is a flow diagram of the assembly process of the multi-chip package of FIG. 1 in accordance with the embodiment.

Referring to FIG. 5, an assembly flow 400 of the method for packaging the plurality of semiconductor dice 110, 120, 130 into a single multi-chip package 100 begins by forming an electrically conductive layer 402 on the upper surface of the substrate 105. As can be seen in FIG. 3, this electrically conductive layer consists of first second and third portions 312, 316 which each include contact pads. The substrate 105 is then provided for assembly 404 with the electrically conductive layer formed thereon.

The lower surface of the first one of plurality of semiconductor dice 110 is then physically coupled 406 to the upper surface of the substrate 105 with the adhesive, the first one of plurality of the semiconductor dice 110 being the smallest one of the plurality of semiconductor dice 110, 120, 130. The first spacer 115 is then adhered 408 to the upper surface of the first one of plurality of the semiconductor dice 110. The first spacer is smaller than the first one of plurality of the semiconductor dice 110 so that it does not cover the electrically conductive contacts 314 on the upper face of the first one of plurality of semiconductor dice 110. A wirebond machine then wirebonds 410 the electrically conductive contacts 314 to bond fingers of the first portion 312 of the contact pads on the upper surface of the substrate 105.

Next, the lower surface of the second one of plurality of semiconductor dice 120 is then physically coupled 412 to the upper surface of the first spacer 115 with the adhesive, the second one of plurality of the semiconductor dice 120 being the next smallest one of the plurality of semiconductor dice 110, 120, 130 (i.e., smaller than the third one of plurality of the semiconductor dice 130 and larger than the first one of plurality of the semiconductor dice 110). The second spacer 125 is then adhered 414 to the upper surface of the second one of plurality of the semiconductor dice 120, the second spacer 125 being smaller than the second one of plurality of the semiconductor dice 120 so that it does not cover the electrically conductive contacts on the upper face thereof.

The electrically conductive contacts on the upper face of the second one of plurality of the semiconductor dice 120 are then wirebonded 416 to a second portion of the contact pads 316 for electrically coupling the second one of plurality of the semiconductor dice 120 to the substrate 105. Next, the lower surface of the third one of plurality of semiconductor dice 130 is then physically coupled 418 to the upper surface of the second spacer 125 with the adhesive, and the electrically conductive contacts on the upper face of the third one of plurality of the semiconductor dice 130 are wirebonded 420 to a third portion of the contact pads 316 for electrically coupling the third one of plurality of the semiconductor dice 130 to the substrate 105.

Finally, the multi-chip package 100 is encapsulated 422 by application of an encapsulant in a manner familiar to those skilled in the art. The resulting package is smaller than a package of the plurality of semiconductor dice 110, 120, 103 assembled using conventional packaging strategies and designs. The smaller package conserves space allowing for the design of smaller electronic devices, such as smaller cellular phones or smaller digital cameras, or the design of similar sized electronic devices with greater functionality by allowing for the provision of more hardware components. Accordingly, the package and packaging techniques which provide smaller semiconductor package sizes in accordance with the embodiment described herein allows for the design of electronic devices with increased functionality and complexity while allowing for decreased size.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method for packaging a plurality of semiconductor dice into a single package comprising the steps of:
   providing a substrate;
   coupling a first one of the plurality of semiconductor dice to the substrate, wherein the first one of the plurality of semiconductor dice is smaller than all other ones of the plurality of semiconductor dice; and
   coupling a second one of the plurality of semiconductor dice to the substrate via a first spacer, wherein the first spacer is adhered to an upper face of the first one of the plurality of semiconductor dice and has a perimeter of a lower face that is smaller than a perimeter of the upper face of the first one of the plurality of semiconductor dice, and
   wherein the second one of the plurality of semiconductor dice is larger than the first one of the plurality of semiconductor dice and the first and second ones of the plurality of semiconductor dice are smaller than all other ones of the plurality of semiconductor dice.

2. The method in accordance with claim 1 wherein the step of providing the substrate comprises the steps of:
   forming an electrically conductive layer in a predefined pattern on an upper face of the substrate; and
   providing the substrate with the electrically conductive layer formed thereon for assembly, and
   wherein the step of coupling the first one of the plurality of semiconductor dice to the substrate comprises the step of physically coupling a lower face of the first one of the plurality of semiconductor dice to the upper face of the substrate.

3. The method in accordance with claim 2 wherein the step of coupling the first one of the plurality of semiconductor dice to the substrate further comprises the step of electrically coupling the first one of the plurality of semiconductor dice to a first portion of the electrically conductive layer of the substrate.

4. The method in accordance with claim 1 wherein the plurality of semiconductor dice is three or more semiconductor dice, and wherein the step of physically coupling the second one of the plurality of semiconductor dice to the first one of the plurality of semiconductor dice further comprises the step of physically coupling a lower face of the second one of the plurality of semiconductor dice to an upper face of the first spacer.

5. The method in accordance with claim 4 further comprising, after the step of physically coupling the second one of the plurality of semiconductor dice to the first one of the plurality of semiconductor dice, the step of electrically coupling the second one of the plurality of semiconductor dice to a second portion of the electrically conductive layer of the substrate.

6. The method in accordance with claim 5 wherein the second one of the plurality of semiconductor dice includes one or more external contacts on an upper face thereof, and wherein the second portion of the electrically conductive layer of the substrate comprises a plurality of contact pads, and wherein the step of electrically coupling the second one of the plurality of semiconductor dice to the second portion of the electrically conductive layer of the substrate comprises the step of wirebonding the one or more external contacts of the second one of the plurality of semiconductor dice to one or more of the plurality of contact pads of the second portion of the electrically conductive layer of the substrate.

7. The method in accordance with claim 6 wherein the electrically conductive layer of the substrate comprises a plurality of contact pads comprising a first portion of the plurality of contact pads, a second portion of the plurality of contact pads and a third portion of the plurality of contact pads, and wherein the each of the plurality of semiconductor dice has contact pads formed on an upper face thereof, and wherein the step of coupling a first one of the plurality of semiconductor dice to the substrate comprises the step of electrically coupling the first one of the plurality of semiconductor dice to a first portion of the plurality of contact pads, the method further comprising the steps of:

after the step of physically coupling the second one of the plurality of semiconductor dice to the first one of the plurality of semiconductor dice, electrically coupling the second one of the plurality of semiconductor dice to the second portion of the plurality of contact pads;

physically coupling a third one of the plurality of semiconductor dice to the second one of the plurality of semiconductor dice, the third one of the plurality of semiconductor dice being larger than the first and second ones of the plurality of semiconductor dice; and electrically coupling the third one of the plurality of semiconductor dice to the third portion of the plurality of contact pads.

8. The method in accordance with claim 7 wherein the step of physically coupling the third one of the plurality of semiconductor dice to the second one of the plurality of semiconductor dice comprises the steps of:

adhering a second spacer to an upper face of the second one of the plurality of semiconductor dice, the second spacer having a perimeter of a lower face thereof smaller than a perimeter of the upper face of the second one of the plurality of semiconductor dice; and physically coupling a lower face of the third one of the plurality of semiconductor dice to an upper face of the second spacer.

\* \* \* \* \*